US008365054B2

(12) United States Patent
Gasanov et al.

(10) Patent No.: US 8,365,054 B2
(45) Date of Patent: Jan. 29, 2013

(54) SOFT REED-SOLOMON DECODER BASED ON ERROR-AND-ERASURE REED-SOLOMON DECODER

(75) Inventors: Elyar E. Gasanov, Moscow (RU); Andrey P. Sokolov, Moscow (RU); Pavel A. Panteleev, Moscow (RU); Ilya V. Neznanov, Moscow (RU); Pavel A. Aliseychik, Moscow (RU)

(73) Assignee: LSI Corporation, Milpitas, CA (US)

( * ) Notice: Subject to any disclaimer, the term of this patent is extended or adjusted under 35 U.S.C. 154(b) by 526 days.

(21) Appl. No.: 12/612,141

(22) Filed: Nov. 4, 2009

(65) Prior Publication Data

US 2010/0281344 A1    Nov. 4, 2010

(30) Foreign Application Priority Data

Apr. 30, 2009  (RU) ................................ 2009116361

(51) Int. Cl.
*H03M 13/00* (2006.01)
(52) U.S. Cl. ........................................................ 714/784
(58) Field of Classification Search .............. 714/752, 714/755, 756, 780, 781, 784, 785
See application file for complete search history.

(56) References Cited

U.S. PATENT DOCUMENTS

| | | | | |
|---|---|---|---|---|
| 5,754,563 A | 5/1998 | White | ........................... | 371/376 |
| 6,047,395 A * | 4/2000 | Zook | ............................. | 714/756 |
| 6,308,295 B1 * | 10/2001 | Sridharan et al. | ............. | 714/755 |
| 6,347,389 B1 * | 2/2002 | Boyer | ........................... | 714/784 |
| 6,498,936 B1 | 12/2002 | Raith | ........................... | 455/466 |
| 6,851,086 B2 | 2/2005 | Szymanski | ................... | 714/781 |
| 6,874,115 B1 | 3/2005 | Laneman et al. | ............. | 714/758 |
| 6,879,267 B2 | 4/2005 | Yamazaki | ...................... | 341/64 |
| 7,185,259 B2 | 2/2007 | Fujita et al. | .................... | 714/755 |
| 7,203,893 B2 | 4/2007 | Kerr et al. | ..................... | 714/780 |
| 7,353,449 B2 | 4/2008 | Muller et al. | .................. | 714/785 |
| 7,409,651 B2 | 8/2008 | Berger et al. | ...................... | 716/3 |
| 7,444,582 B1 | 10/2008 | Au et al. | ......................... | 714/784 |
| 7,454,690 B1 | 11/2008 | Au et al. | ......................... | 714/780 |
| 2003/0103582 A1 | 6/2003 | Linsky et al. | .................. | 375/327 |
| 2006/0236212 A1 * | 10/2006 | Lee et al. | ....................... | 714/784 |
| 2006/0248435 A1 * | 11/2006 | Haratsch | ....................... | 714/784 |
| 2007/0204207 A1 * | 8/2007 | Ma et al. | ......................... | 714/785 |
| 2007/0288827 A1 | 12/2007 | Song et al. | ..................... | 714/755 |
| 2007/0288833 A1 | 12/2007 | Djurdjevic et al. | ........... | 714/784 |
| 2008/0052609 A1 * | 2/2008 | Peng et al. | ..................... | 714/799 |

OTHER PUBLICATIONS

Moon, Todd K., "Error Correction Coding: Mathematical Methods and Algorithms", John Wiley & Sons, Inc. Publisher, 2005, pp. 358-365.
Forney, Jr., David G., "Generalized Minimum Distance Decoding", IEEE Transactions on Information Theory, vol. IT-12, No. 2, Apr. 1966, pp. 125-131.
Kamiya, Norifumi, "On Multisequence Shift Register Synthesis and Generalized-Minimum-Distance Decoding of Reed-Solomon Codes", Finite Fields and Their Applications 1, 1995, pp. 440-457.
Kamiya, Norifumi, "On Acceptance Criterion for Efficient Successive Errors-and-Erasures Decoding of Reed-Solomon and BCH Codes", IEEE Transactions on Information Theory, vol. 42, No. 5, Sep. 1997, pp. 1477-1488.

\* cited by examiner

*Primary Examiner* — Scott Baderman
*Assistant Examiner* — Joseph Kudirka
(74) *Attorney, Agent, or Firm* — Christopher P. Maiorana, PC (57) ABSTRACT

An apparatus having a first circuit and a second circuit is disclosed. The first circuit may (i) generate a decoded codeword by decoding a first codeword a plurality of times based on a respective plurality of erasure location vectors and (ii) assert a fail signal upon each failure of the decoding of the first codeword, the decoding comprising an error-and-erasure Reed-Solomon decoding. The second circuit may (i) generate a count of the assertions of the fail signal and (ii) generate the erasure location vectors based on (a) the count and (b) a plurality of reliability items corresponding to the first codeword.

20 Claims, 10 Drawing Sheets

SOFT REED-SOLOMON DECODER BASED ON ERROR-AND-ERASURE REED-SOLOMON DECODER

This application claims the benefit of Russian Application No. 2009116361, filed Apr. 30, 2009 and is hereby incorporated by reference in its entirety.

CROSS REFERENCE TO RELATED APPLICATIONS

The present application is related to co-pending U.S. patent application Ser. No. 12/182,443, filed December Jul. 30, 2008, which is hereby incorporated by reference in its entirety.

FIELD OF THE INVENTION

The present invention relates to soft decoders generally and, more particularly, to a method and/or apparatus for implementing a soft Reed-Solomon decoder based on an error-and-erasure Reed-Solomon decoder.

BACKGROUND OF THE INVENTION

Reed-Solomon (RS) codes are a powerful class of multiple error-correcting codes. RS codes have a wide range of applications, such as optical communications, and wireless communications magnetic recording systems. When applying systematic Reed-Solomon encoding, data is transmitted in codewords that represent a combination of the original data symbols and a number of parity symbols. An RS code that uses 2t parity symbols is commonly correctable to t errors. The value of t is commonly called a maximum error limit. An RS decoder uses the 2t parity symbols to correct a received message, even if the received message experiences up to t errors during transmission.

In many modern communication systems, RS decoders use extra information along with received data. A reliability value is calculated for each received data symbol. RS decoders that use the reliability information are called soft decoders. Received data symbols with very small reliability are called erasures. If a particular data symbol in a received codeword is known to be an erasure, a value of the particular symbol is ignored when the RS decoder attempts to decode the codeword. If ν errors and ρ erasures occur during transmission of a codeword, the codeword can be corrected if and only if $\nu+\rho \leq 2t$. RS decoders that use information about erasures are called error-and-erasure decoders.

Figure 1:
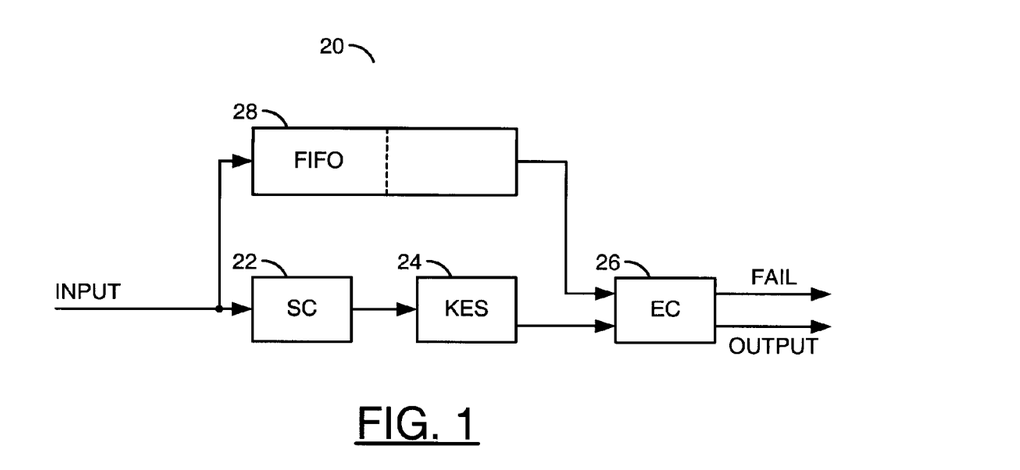
FIG. 1 is a block diagram of a conventional Reed-Solomon decoder.

Referring to FIG. 1, a block diagram of a conventional RS decoder 20 is shown. The decoder 20 includes a circuit 22 for Syndrome Calculations (SC), a circuit 24 for Key Equation Solving (KES), a circuit 26 for Error Correction (EC) and a First-In-First-Out (FIFO) buffer 28. In operation, the circuit 22 accepts a received codeword symbol-by-symbol and provides a set of syndromes to the circuit 24. The circuit 24 calculates an error locator polynomial based on the syndromes. The error locator polynomial provides the positions of errors. The circuit 24 implements a key equation solving technique, such as the Berlekamp-Massey technique, the Euclidian technique or the Peterson technique. The circuit 24 calculates an errata polynomial. The errata polynomial provides the magnitudes of errors in the error positions. The circuit 24 passes the errata polynomial to the circuit 26. The circuit 26 uses the errata polynomial to perform data corrections. A binary failure signal (i.e., FAIL) of the circuit 26 is asserted if a number of corrected data symbols is more than the maximum error limit.

Figure 2:
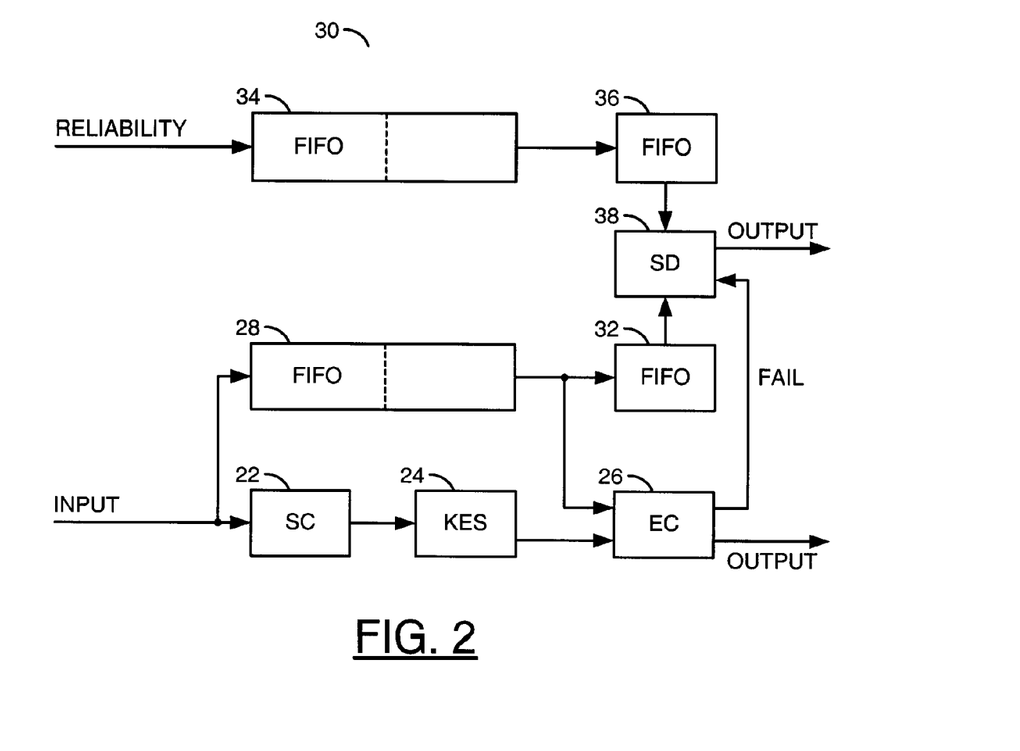
FIG. 2 is a block diagram of a conventional soft Reed-Solomon decoder.

Referring to FIG. 2, a block diagram of a conventional soft RS decoder 30 is shown. The decoder 30 includes the circuit 22, the circuit 24, the circuit 26 and the FIFO 28. An additional FIFO 32 saves the codewords from the FIFO 28. FIFOs 34 and 36 save reliability information received in a signal (i.e., RELIABILITY). A Soft Decoder (SD) circuit 38 decodes each error-filled codeword that the circuit 26 fails to correct. While the circuit 38 works on an error-filled codeword, the circuits 22 to 28 can process other codewords. The circuit 38 conventionally has a software implementation due to cost. As a result, software decisions are relatively slow. The slow decisions are typically acceptable under an assumption that the circuit 26 rarely fails to correct all of the errors in the codewords.

SUMMARY OF THE INVENTION

The present invention concerns an apparatus having a first circuit and a second circuit. The first circuit may (i) generate a decoded codeword by decoding a first codeword a plurality of times based on a respective plurality of erasure location vectors and (ii) assert a fail signal upon each failure of the decoding of the first codeword, the decoding comprising an error-and-erasure Reed-Solomon decoding. The second circuit may (i) generate a count of the assertions of the fail signal and (ii) generate the erasure location vectors based on (a) the count and (b) a plurality of reliability items corresponding to the first codeword.

The objects, features and advantages of the present invention include providing a method and/or apparatus for implementing a soft Reed-Solomon decoder based on an error-and-erasure Reed-Solomon decoder that may provide (i) a high-speed soft decode, (ii) hardware-only designs, (iii) pipeline decoding of multiple codewords at a time and/or (iv) iterate decoding of a corrupted codeword through the same circuitry.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally suggest a hardware-only scheme of soft Reed-Solomon (RS) decoders based on error-and-erasure RS decoders. The resulting decoders may occupy a small area and achieve a high performance. For each received codeword, if a respective number of occurred errors v is less than 2t, the decoder works on such good codewords in a pipelined manner. If the occurred errors v are greater than 2t, such erroneous codewords are processed iteratively. The decoder generally performs one or more (e.g., up to t+1) iterations for each of the erroneous codewords. While iterating an erroneous codeword, the decoder may process other good codewords at the same time. However, the processing throughput may decrease because resources are used correcting the erroneous codeword instead of the next good codeword.

Figure 3:
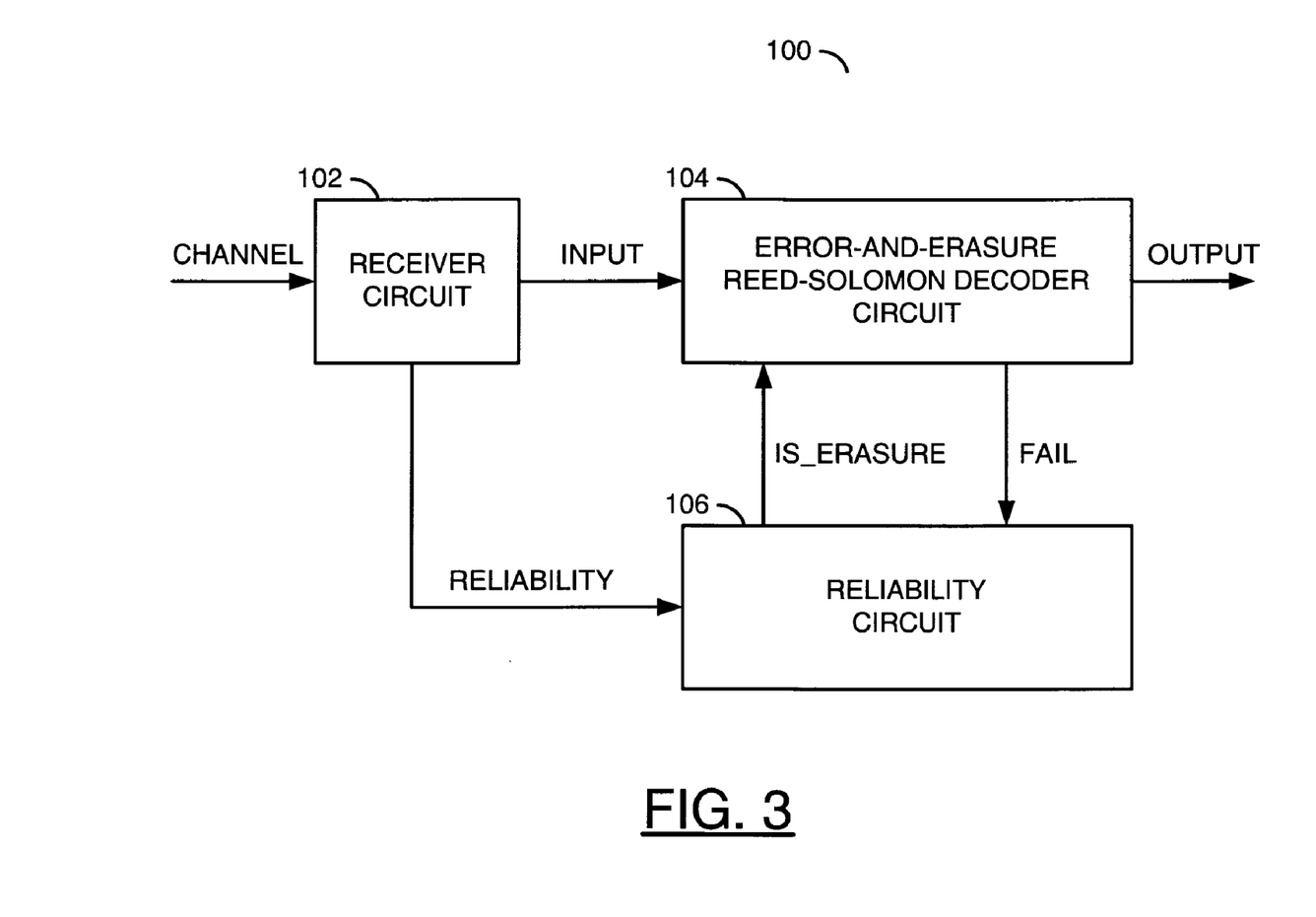
FIG. 3 is a block diagram of an apparatus in accordance with a preferred embodiment of the present invention.

Referring to FIG. 3, a block diagram of an apparatus 100 is shown in accordance with a preferred embodiment of the present invention. The apparatus 100 may implement a soft Reed-Solomon (RS) decoder circuit. The apparatus 100 may also be referred to as a circuit or system. In some embodiments, the apparatus 100 may be implemented in hardware-only designs. The apparatus 100 generally comprises a circuit 102, a circuit 104 and a circuit 106. The circuits 102 to 106 may represent modules and/or blocks that may be implemented as hardware, software, a combination of hardware and software, or other implementations.

A signal (e.g., CHANNEL) may be received by the circuit 102. The signal INPUT may be generated by the circuit 102 and presented to the circuit 104. The circuit 104 may generate and present the signal OUTPUT. The circuit 104 may also generate the signal FAIL that is received by the circuit 106. The signal RELIABILITY may be generated by the circuit 102 and presented to the circuit 106. The circuit 106 may generate a signal (e.g., IS_ERASURE) that is receive by the circuit 104.

The signal INPUT may convey a received codeword, also referred to as a vector $v=(v_0, v_1, \ldots, v_{n-1})$. The received codeword $v(x)$ may have been encoded per the Reed-Solomon coding and transmitted through a noisy signal CHANNEL to the circuit 102. The signal OUTPUT may convey the reconstructed codeword $c(x)$. The signal RELIABILITY may convey (i) respective reliability values calculated for the received symbols and (ii) respective positions of the symbols. The signal FAIL is generally asserted (e.g., a logical one state) if a number of corrected data symbols are more than a maximum error limit. The signal IS_ERASURE generally carries an erasure location vector (e.g., θ). A vector $\theta=(\theta_0, \theta_1, \ldots, \theta_{n-1}) \in \{0,1\}^n$ generally comprises a sequence of binary elements containing information about erasures, where $\theta_j=1$ indicates an erasure at position $j \in [0,n)$. A set all erasure positions $\{j \in [0,n) | \theta_j=1\}$ may be denoted by [θ].

The circuit 102 generally implements a receiver circuit. The circuit 102 may be operational to covert a sequence of symbols received through the signal CHANNEL into the signal INPUT and the signal RELIABILITY. Generation of the signals INPUT and RELIABILITY may be performed by common techniques.

The circuit 104 may implement an error-and-erasure Reed-Solomon decoder circuit. The circuit 104 is generally operational to decode the symbols received in the signal INPUT to recreate the original data in the signal OUTPUT. Decoding may be performed in a pipeline fashion where multiple (e.g., up to 3) codewords are being processed substantially simultaneously. The decoding may utilize the erasure location vector received in the signal IS_ERASURE. Where a codeword has too may errors to correct, the circuit 104 may assert the signal FAIL. Each codeword that fails to decode during an initial pass through the circuit 104 may be repeatedly decoded by the circuit 104 based on a respective plurality of erasure location vectors. The decoding may be repeated up to a maximum number of times. If the codeword still fails decoding after t+1 iterations, the failed codeword may be considered unrecoverable. Where the codeword has no errors to correct, or only a correctable number of errors, the circuit 104 may decode in a single pass and the signal FAIL may be deasserted (e.g., a logical zero state).

The circuit 106 may implement a reliability circuit. The circuit 106 is generally operational to calculate the appropriate erasure location vector for a current one of the codewords in the process of being decoded by the circuit 104. Each of the error location vectors may be based on the reliability information received in the signal RELIABILITY and the number of iterations through the circuit 104 that the current codeword has experienced. The circuit 106 may keep track of the iterations by keeping a count of the assertions of the signal FAIL.

Figure 4:
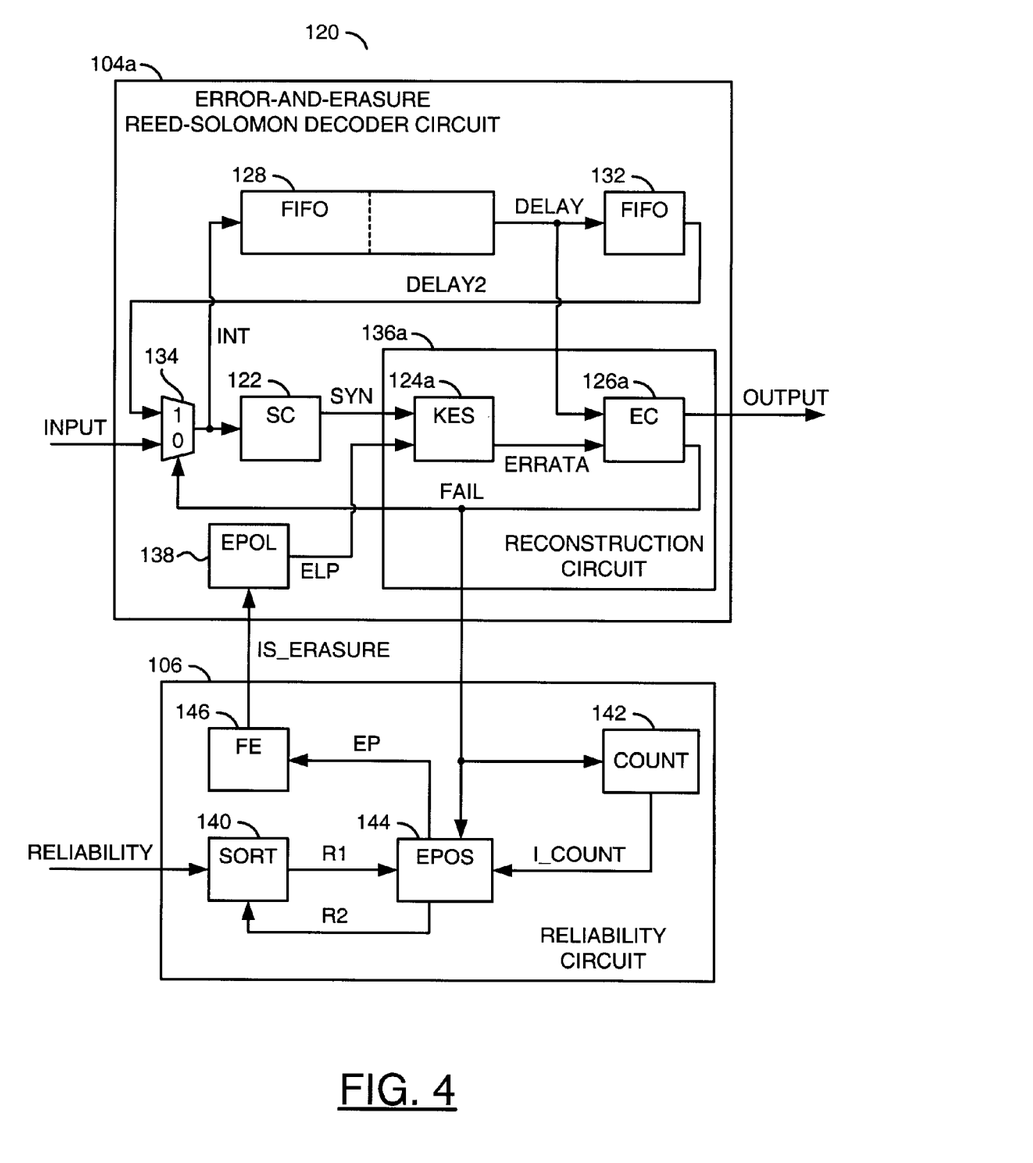
FIG. 4 is a block diagram of a first example implementation of the apparatus.

Referring to FIG. 4, a block diagram of a first example implementation 120 of the apparatus 100 is shown. The apparatus 120 generally comprises the circuit 102 (as shown in FIG. 3), a circuit 104a and the circuit 106. The circuit 104a may be a first embodiment of the circuit 104. The circuit 104a generally comprises a circuit 122, a circuit 128, a circuit 132, a circuit 134, a circuit 136a and a circuit 138. The circuit 136a generally comprises a circuit 124a and a circuit 126a. A pipeline may be formed by the circuits 122, 124a and 126a, a single stage for each of the circuits. In some embodiments, processing by each of the stages may be completed in a single cycle. The circuits 122 to 138 may represent modules and/or blocks that may be implemented as hardware, software, a combination of hardware and software, or other implementations.

The circuit 134 may receive the signal INPUT from the circuit 102. A signal (e.g., DELAY) may be presented from the circuit 128 to the circuit 132 and the circuit 126a. A signal (e.g., DELAY2) may be presented from the circuit 132 to the circuit 134. The circuit 134 may multiplex the signal INPUT and the signal DELAY2 to the circuit 122 and the circuit 128 in an intermediate signal (e.g., INT). Control of the circuit 134 may be provided by the signal FAIL. The circuit 126a may generate and present the signal FAIL to the circuit 134 and the circuit 106. The circuit 138 may receive the signal IS_ERASURE from the circuit 106. A signal (e.g., SYN) may be generated by the circuit 122 and presented to the circuit 124a. A signal (e.g., ELP) may be generated by the circuit 138 and presented to the circuit 124a. The circuit 124a may generate a signal (e.g., ERRATA) that is received by the circuit 126a.

The circuit 122 may be implemented as a syndrome calculator circuit. The circuit 122 is generally operation to calculate and present the syndromes of the codewords. The codewords may be received via the signal INT. The syndromes may be presented in the signal SYN.

The circuit 124a may be implemented as a key equation solver circuit. The circuit 124a may be operational to calculate an errata polynomial (e.g., e(x)) based on the syndromes from the signal SYN and an erasure location polynomial from the signal ELP.

The circuit 126a may implement an error correction circuit. The circuit 126a is generally operational to calculate the reconstructed codewords (e.g., c(x)) based on the errata polynomial and a delayed copy of the received codeword (e.g., c(x)=v(x)+e(x)). The circuit 126a may also be operational to generate the signal FAIL based on the information provided in the signal ERRATA.

The circuit 128 may implement a FIFO circuit. The circuit 128 may be designed to hold multiple copies (e.g., 2) of received codewords during multiple (e.g., 2) pipeline stages. After the delay, the each buffered codeword may be presented in sequence in the signal DELAY.

The circuit 132 may implement a FIFO circuit. The circuit 132 generally holds a copy of the codeword received from the circuit 128 during an additional pipeline delay. The held codeword may be presented in the signal DELAY2 back to the circuit 134.

The circuit 134 may be implemented as a 2:1 multiplexer. Control of the circuit 134 may be provided by the signal FAIL. When the signal FAIL is asserted (e.g., binary one) the circuit 134 may route the signal DELAY2 to the signal INT. When the signal FAIL is deasserted (e.g., binary zero) the circuit 134 may route the signal INPUT to the signal INT.

The circuit 138 may implement an erasure polynomial calculation (EPOL) circuit. The circuit 138 is generally operational to calculate an erasure locator polynomial in the signal ELP based on the erasure location vector received in the signal IS_ERASURE. The erasure location vector of the signal IS_ERASURE generally has a binary one value for each of the current codeword symbols that is an erasure. The erasure location vector generally has a binary zero value for each of the current codeword symbols that is not an erasure. The circuit 138 may calculate the erasure locator polynomial that provides the positions of the erasures. Additional details regarding the circuits 122, 128, 136a and 138 may be found in the co-pending U.S. patent application Ser. No. 12/182,443, which is hereby incorporated by reference in its entirety. A simple way to take into account the erasures may be to use an erasure locator polynomial having an initial value of the error locator vector in the Berlekamp-Massey technique.

The circuit 106 generally comprises a circuit 140, a circuit 142, a circuit 144 and a circuit 146. The circuits 140 to 146 may represent modules and/or blocks that may be implemented as hardware, software, a combination of hardware and software, or other implementations.

The circuit 140 may receive the signal RELIABILITY. The circuit 140 may generate a signal (e.g., R1) presented to the circuit 144. A signal (e.g., R2) may be generated by the circuit 144 and presented back to the circuit 140. The signal FAIL may be received by the circuit 142 and the circuit 144. A signal (e.g., I_COUNT) may be generated by the circuit 142 and received by the circuit 144. A signal (e.g., EP) may be generated by the circuit 144 and presented to the circuit 146. The circuit 146 may generate the signal IS_ERASURE, which is received by the circuit 138.

The circuit 140 generally implements a reliability value sorting circuit (SORT). The circuit 140 generally accepts the received reliability information symbol-by-symbol from the signal RELIABILITY and fills two reliability arrays. The first array may contain 2t reliability values. The second array may contain 2t positions of the codeword symbols. The circuit 140 may be operational to sort the reliability values in the first array, arranging the values in an order ranging from most reliable to least reliable. The second array may be sorted in the same order such that the positions of codeword symbols continue to correspond to the reliability values in the first array. The two arrays may be passed to the circuit 144 in the signal R1.

The circuit 142 generally implements an iteration count circuit (COUNT). The circuit 142 may be operational to count and save the number of process iterations of each codeword by counting the number of times the signal FAIL is asserted. For each new codeword received from the circuit 102, the corresponding count may be initialized to a predetermined value (e.g., 1). If a particular codeword is processed second time, the circuit 142 returns a value of 2 in the signal I_COUNT, and so on.

The circuit 144 generally implements an Erasure POSition circuit (EPOS). The circuit 144 may be operational to pass some or all of the second array to the circuit 146 based on the signal I_COUNT. The circuit 144 generally forms a new array having a size of 2*I_COUNT positions corresponding of smallest reliability values of the first array received in the signal R1. The circuit 144 may sort the positions within the new array in an increasing order. The 2*I_COUNT positions are generally considered as erasure positions. If the current codeword fails during the decoding operation, the circuit 144 may provide the erasure positions in the signal EP to the circuit 146. The circuit 144 may also return the original two arrays to the circuit 140 in the signal R2. If the current codeword contains only correctable errors, (i) the circuit 144 may dump the arrays, (ii) present no erasure positions to the circuit 146 and (iii) not return the arrays to the circuit 140.

The circuit 146 may be implemented as a signal formation circuit (FE). The circuit 146 is generally operational to create the erasure location vector in the signal IS_ERASURE based on the positions received in the signal EP. Each location n in the erasure location vector[n] may be set to a first value (e.g., binary one) if the location n belongs to an erasure position. Each location n in the erasure location vector[n] may be set to a second value (e.g., binary zero) if the location n is not an erasure position. During the initial pass of a current codeword through the circuit 104a, the circuit 146 may set all of the locations n to the second value (e.g., erasure location vector[n]=0 for all n). The circuit 146 may pass the signal IS_ERASURE to the circuit 138. The circuit 138 may subsequently calculate the erasure locator polynomial, providing the positions of the erasures.

Figure 5:
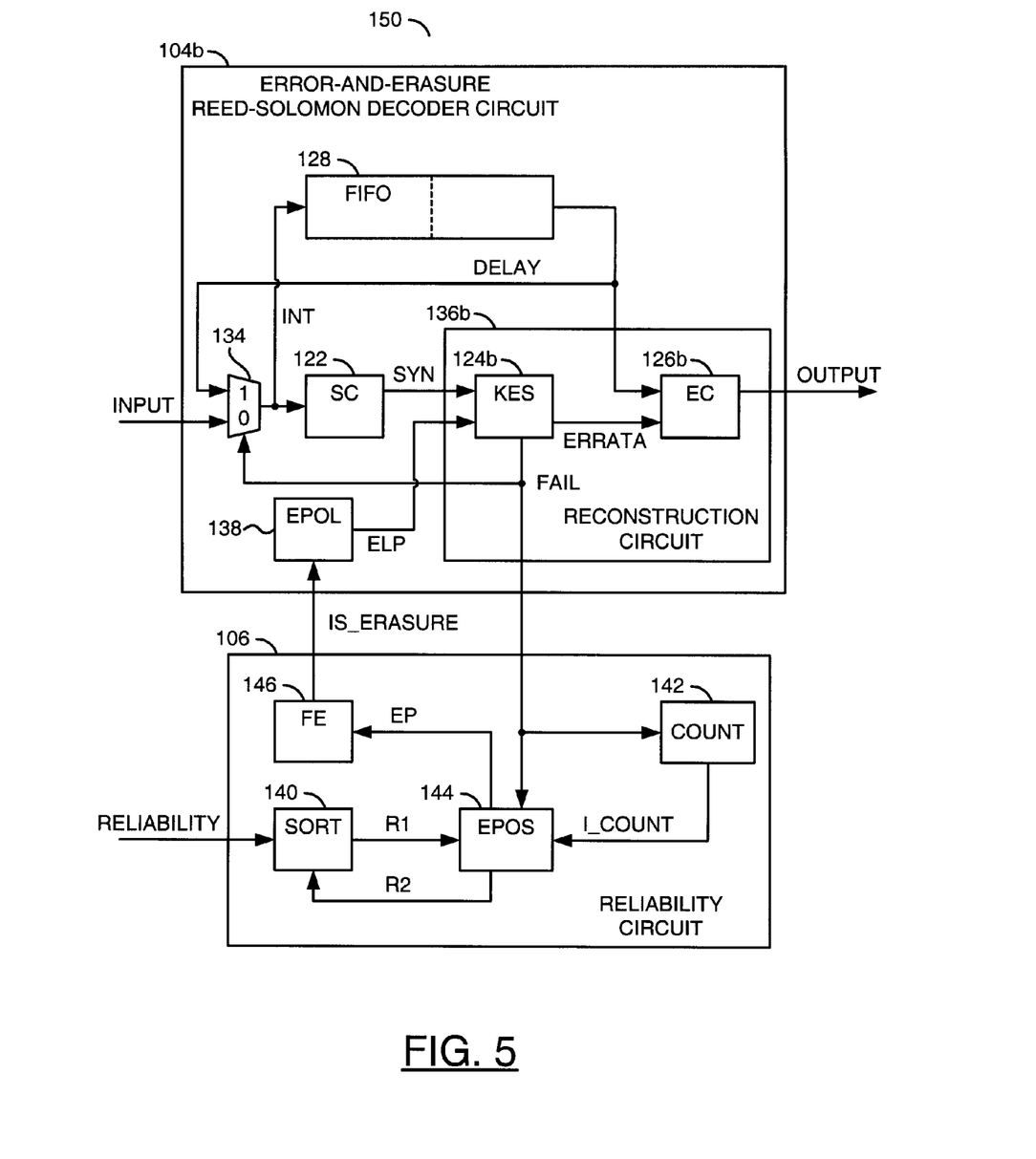
FIG. 5 is a block diagram of a second example implementation of the apparatus.

Referring to FIG. 5, a block diagram of a second example implementation 150 of the apparatus 100 is shown. The apparatus 150 generally comprises the circuit 102, a circuit 104b and the circuit 106. The circuit 104b may be a second embodiment of the circuit 104. The circuit 104b generally comprises the circuit 122, a circuit 136b and the circuit 138. The circuit 136b generally comprises a circuit 124b and a circuit 126b. A pipeline may be formed by the circuits 122, 124b and 126b, a single stage for each of the circuits. In some embodiments, processing by each of the stages may be completed in a single cycle. The circuits 122 to 138 may represent modules and/or blocks that may be implemented as hardware, software, a combination of hardware and software, or other implementations.

A first difference between the circuit 104b and the circuit 104a maybe that the circuit 124b generates the signal FAIL instead of the circuit 126a. In order for the circuit 124b to produce the signal FAIL, each of the codewords should contain 2t+1 parity symbols and the circuit 122 should provide a set of 2t+1 syndromes in the signal SYN. A second difference may be the absence of the circuit 132 from the circuit 104b. Since the signal FAIL is determined earlier in the pipeline of the circuit 104b compared to the circuit 104a, the buffered codewords may be forgotten after the second pipeline stage. A third difference may be the absence of the signal DELAY2 in the circuit 104b. Therefore, the circuit 134 may multiplex the signal DELAY and the signal INPUT into the signal INT.

The schemes described in FIG. 4 and FIG. 5 may have the same general idea. Each codeword may be processed several times (iterations) with a maximum number of iterations being no more than t+1. In a first iteration, each codeword may be processed without the reliability information. If a given codeword is successfully corrected by the circuit 104a/104b, the work for the given codeword is completed. If the decoding operation fails the first iteration, the codeword may be returned from the circuit 132 (FIG. 4) or 128 (FIG. 5) to the circuit 122 and a next iteration started. In the $k^{th}$ iteration, where $k \in \{2, 3, \ldots, t+1\}$, the circuit 146 may form 2(k−1) erasures. The subsequent decoding operation may take into account the information regarding the 2(k−1) erasures identified in the $(k-1)^{th}$ iteration. If the decoding operation fails again after t+1 iterations, too many errors may exist in the received codewords to be corrected.

Figure 6:
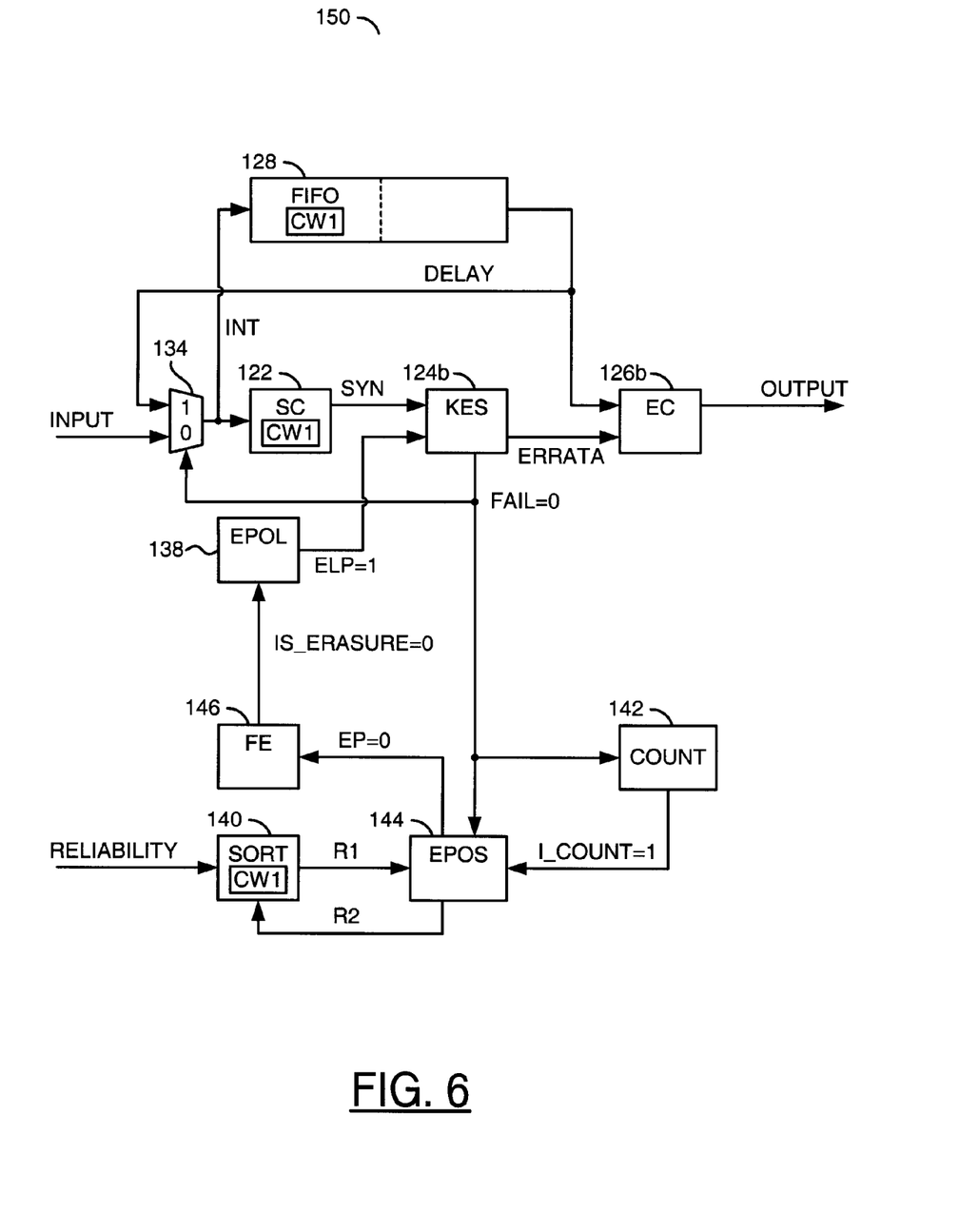
FIG. 6 is a block diagram illustrating the apparatus at an end of a first step in decoding a codeword.
Figure 7:
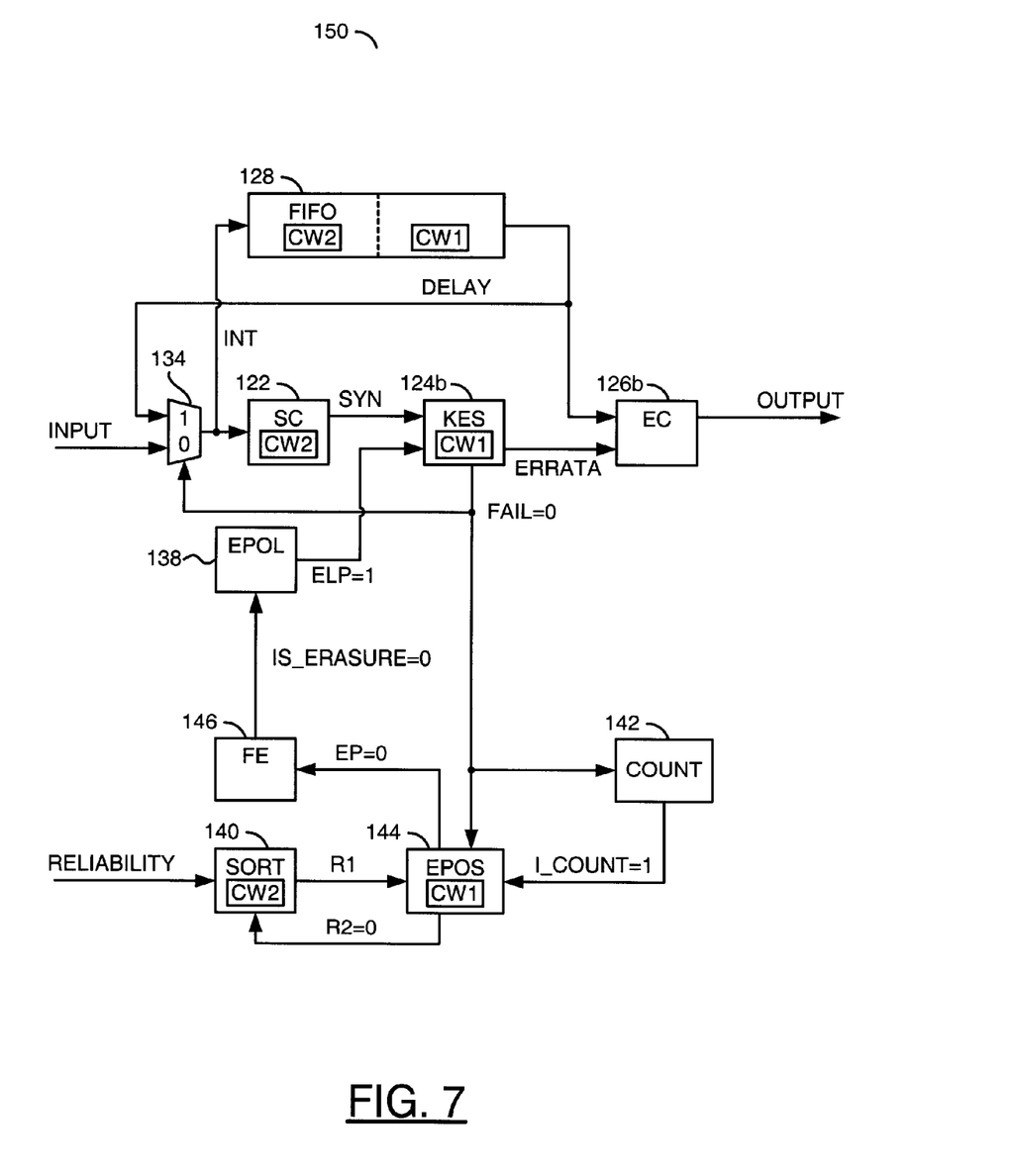
FIG. 7 is a block diagram illustrating the apparatus at the end of a second step in the decoding in which corrections for the codeword are successfully calculated.
Figure 8:
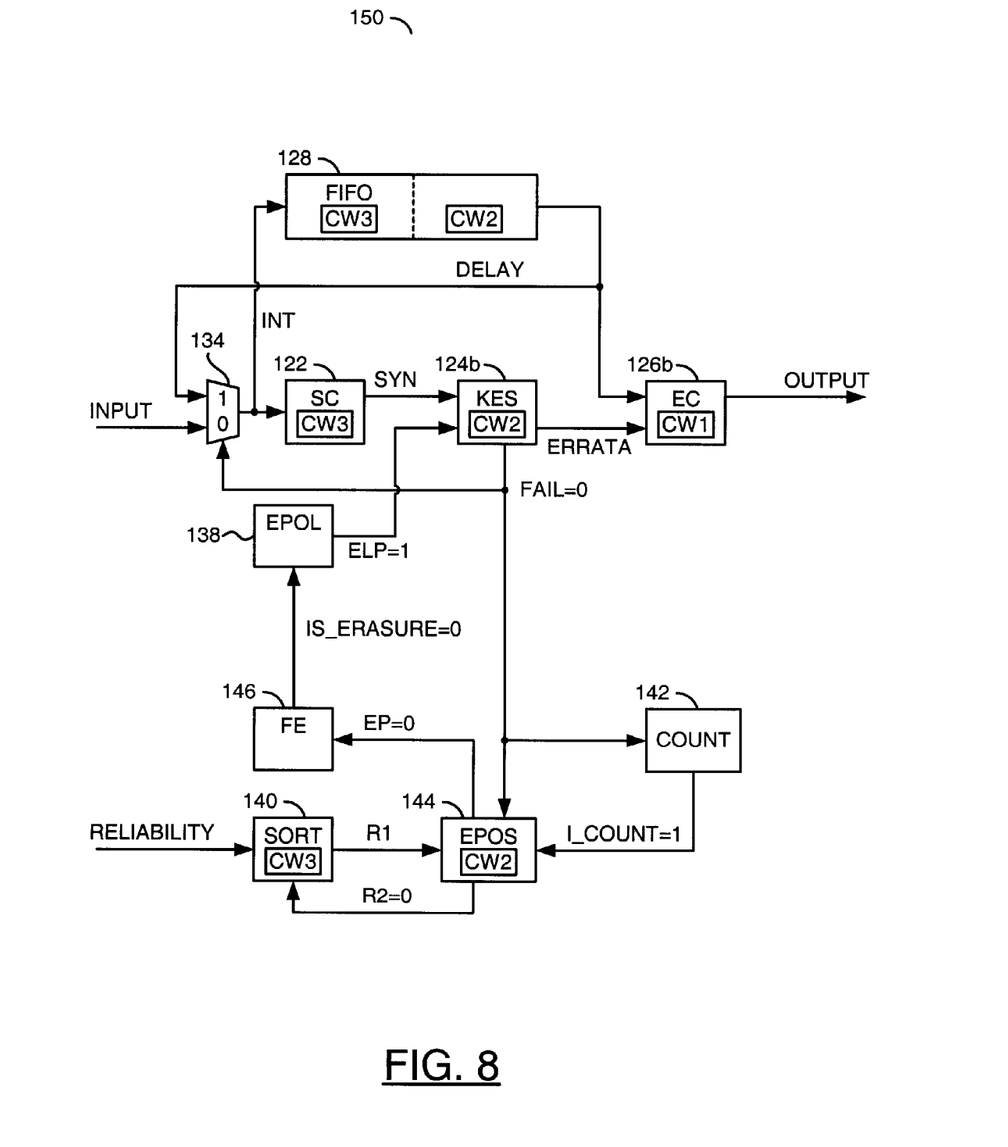
FIG. 8 is a block diagram illustrating the apparatus at the end of a third step in the decoding.

FIGS. 6 to 8 generally illustrate an example data flow for a regular case of soft RS decoding where a first codeword is successfully decoded in an initial iteration. Referring to FIG. 6, a block diagram illustrating the apparatus 150 at an end of a first step in decoding a codeword is shown. In the first step, a first codeword (e.g., CW1) may be received in the signal INPUT and the corresponding reliability information may be received in the signal RELIABILITY. The circuit 122 may begin the first stage of decoding by calculating the syndromes corresponding to the codeword CW1. Concurrently with the operations of the circuit 122, the circuit 128 may buffer the codeword CW1 and the circuit 140 may sort the reliability information. The circuit 124b may initially deassert the signal FAIL (e.g., FAIL=0) as no failures have yet to be detected. The circuit 142 may set an initial count in the signal I_COUNT (e.g., I_COUNT=1) to indicate an initial iteration of the codeword CW1 to the circuit 144. The circuit 144 may indicate no erasure positions to the circuit 146 (e.g., EP=0). The circuit 146 may initialize the signal IS_ERASURE (e.g., IS_ERASURE=0). The circuit 138 may present a value of 1 for the erasure location polynomial (e.g., ELP=1), meaning that no erasures exist for the codeword CW1 at the moment.

At the end of the first step, the circuit 128 generally contains the codeword CW1. The circuit 122 has calculated the syndromes for the codeword CW1. The circuit 140 has sorted the two reliability arrays of the codeword CW1.

Referring to FIG. 7, a block diagram illustrating the apparatus 150 at the end of a second step in the decoding is shown in which corrections for the codeword CW1 are successfully calculated. In the second step, the codeword CW2 is generally processed by the circuit 122 and buffered in the circuit 128. The circuit 124b may processes the syndromes of the codeword CW1 to calculate the errata polynomial. The circuit 140 may processes the reliability arrays for the codeword CW2. The circuit 142 may continue to present a value of 1 in the signal I_COUNT because the codeword CW1 is still in the initial iteration. The circuit 144 generally receives the signal I_COUNT from the circuit 142 and processes the two arrays to identify the 2 smallest reliability values and the corresponding symbols positions in the codeword CW1. The circuit 144 may continue to present no erasure positions in the signal EP because the signal FAIL is deasserted. The circuit 146 may continue forms the signal IS_ERASURE as zero. The circuit 138 may continue to form the signal ELP as the constant 1.

At the end of the second step, the circuit 128 contains both of the codewords CW1 and CW2. The circuit 122 has calculated the syndromes for the codeword CW2. The circuit 124b has calculated the errata polynomial for the codeword CW1 and may continue deasserting the signal FAIL, meaning that the degree of the errata polynomial is no more than 2t and no extra errors exist. The circuit 140 has sorted the arrays of the codeword CW2. The circuit 144 may have dumped the 2 erasure positions for the codeword CW1 because the signal FAIL is deasserted. The 2 erasure positions are generally not passed to the circuit 146 (e.g., EP=0).

Referring to FIG. 8, a block diagram illustrating the apparatus 150 at the end of a third step in the decoding is shown. The circuit 122 may begin processing a third codeword (e.g., CW3). The codeword CW3 may also be buffered in the circuit 128. The circuit 124b may process the syndromes of the codeword CW2. The circuit 126b may begin correcting the codeword CW1 in the third stage. The received symbols of the codeword CW1 may be passed to the circuit 126b from the circuit 128 and the errata polynomial may be transferred from the circuit 124b. The circuit 140 may process the reliability information for the codeword CW3. The circuit 142 may generate a value of 1 in the signal I_COUNT to indicate an initial iteration of the codeword CW2 to the circuit 144. The circuit 144 may receive the signal I_COUNT from the circuit 142 and processes the two reliability arrays for the codeword CW2. The circuit 146 generally initializes the signal IS_ERASURE. The circuit 138 may initialize the error locator polynomial.

At the end of the third step, the circuit 128 generally contains the codewords CW2 and CW3. The circuit 122 has calculated the syndromes for the codeword CW3. The circuit 124b has calculated the errata polynomial for the codeword CW2 and deassert the signal FAIL. The circuit 126b has generated the corrected codeword CW1. The circuit 140 has sorted (i) the array of 2t smallest reliability values and (ii) the array of positions of symbols of the codeword CW3. The circuit 144 may have dumped the 2 erasure positions determined for the codeword CW2 because the signal FAIL is deasserted.

Figure 9:
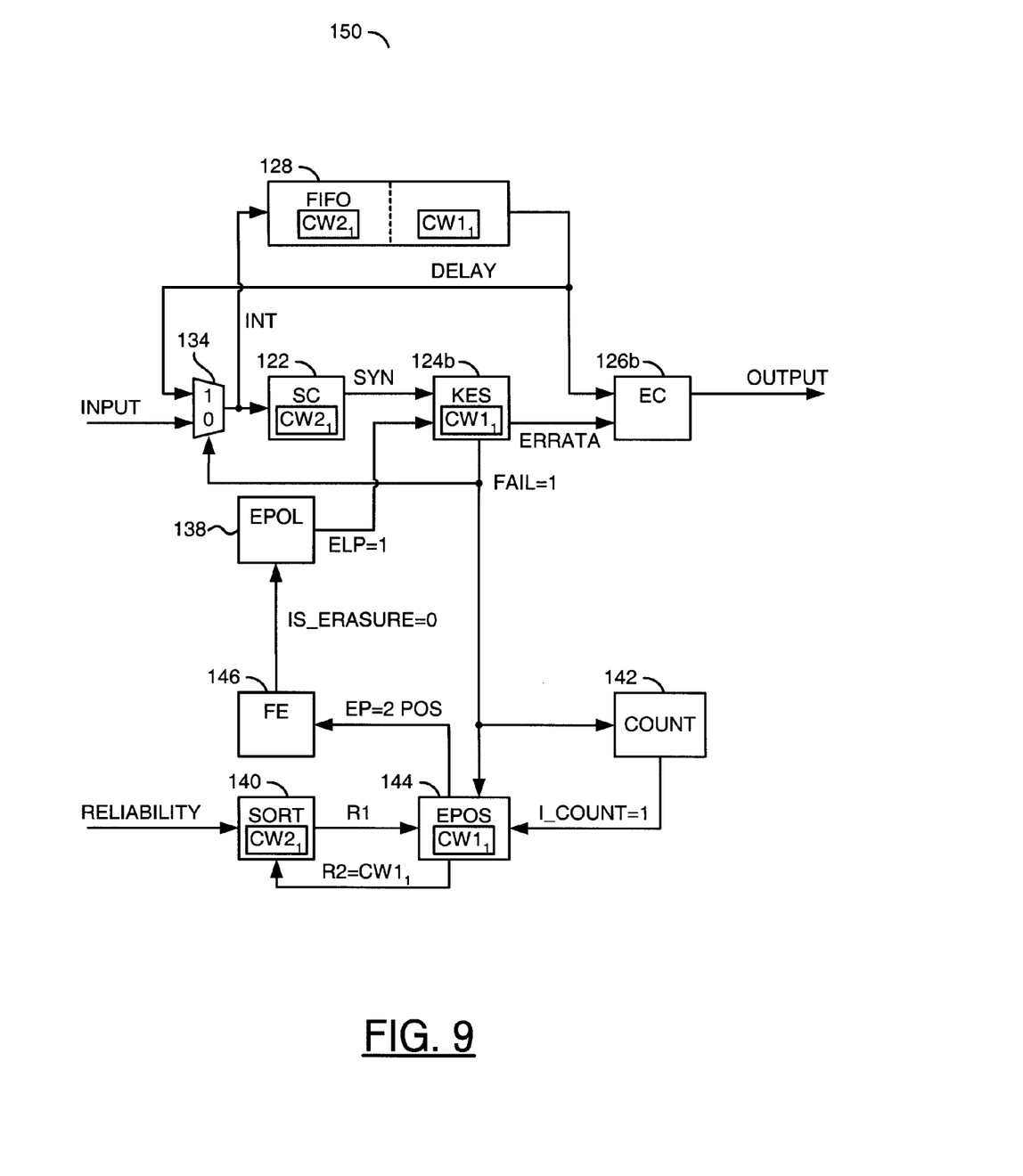
FIG. 9 is a block diagram illustrating the apparatus at the end of the second step in which the codeword may fail the decoding operation.

FIGS. 6 and 9 to 11 generally illustrate a data flow for a case of soft RS decoding where the first codeword CW1 fails the initial decoding. The first step illustrated in FIG. 6 remains the same as before. Referring to FIG. 9, a block diagram illustrating the apparatus 150 at the end of the second step is shown in which the codeword CW1 may fail the decoding operation. A subscript "N" may be used to denote a particular iteration for which the codeword information is related. For example, "$CW1_3$" generally refers to information related to the third iteration of the codeword CW1.

In the second step, the circuit 122 may calculate the syndromes for the codeword $CW2_1$. The circuit 124b may determine that the codeword $CW1_1$ cannot be corrected and thus asserts the signal FAIL (e.g., FAIL=1). The circuit 140 may sort the reliability information for the codeword $CW2_1$. The circuit 142 may count the assertion of the signal FAIL related to the codeword $CW1_1$. The circuit 142 may still present a value of 1 in the signal I_COUNT to indicate that the first iteration of the codeword $CW1_1$ is still in progress. The circuit 144 may process the reliability arrays and present the 2 most-likely erasure positions in the signal EP in response to the signal FAIL being asserted. The circuit 146 may form the initial signal IS_ERASURE. The circuit 138 may form the initial signal ELP.

At the end of the second step, the circuit 144 has calculated the 2 erasure positions for the codeword $CW1_1$. The circuit 140 has sorted the two reliability arrays for the codeword $CW2_1$. The arrays for the codeword $CW1_1$ may be passed from the circuit 144 back to the circuit 140 in the signal R2. The circuit 146 may receive the 2 error positions for the codeword $CW1_1$.

Figure 10:
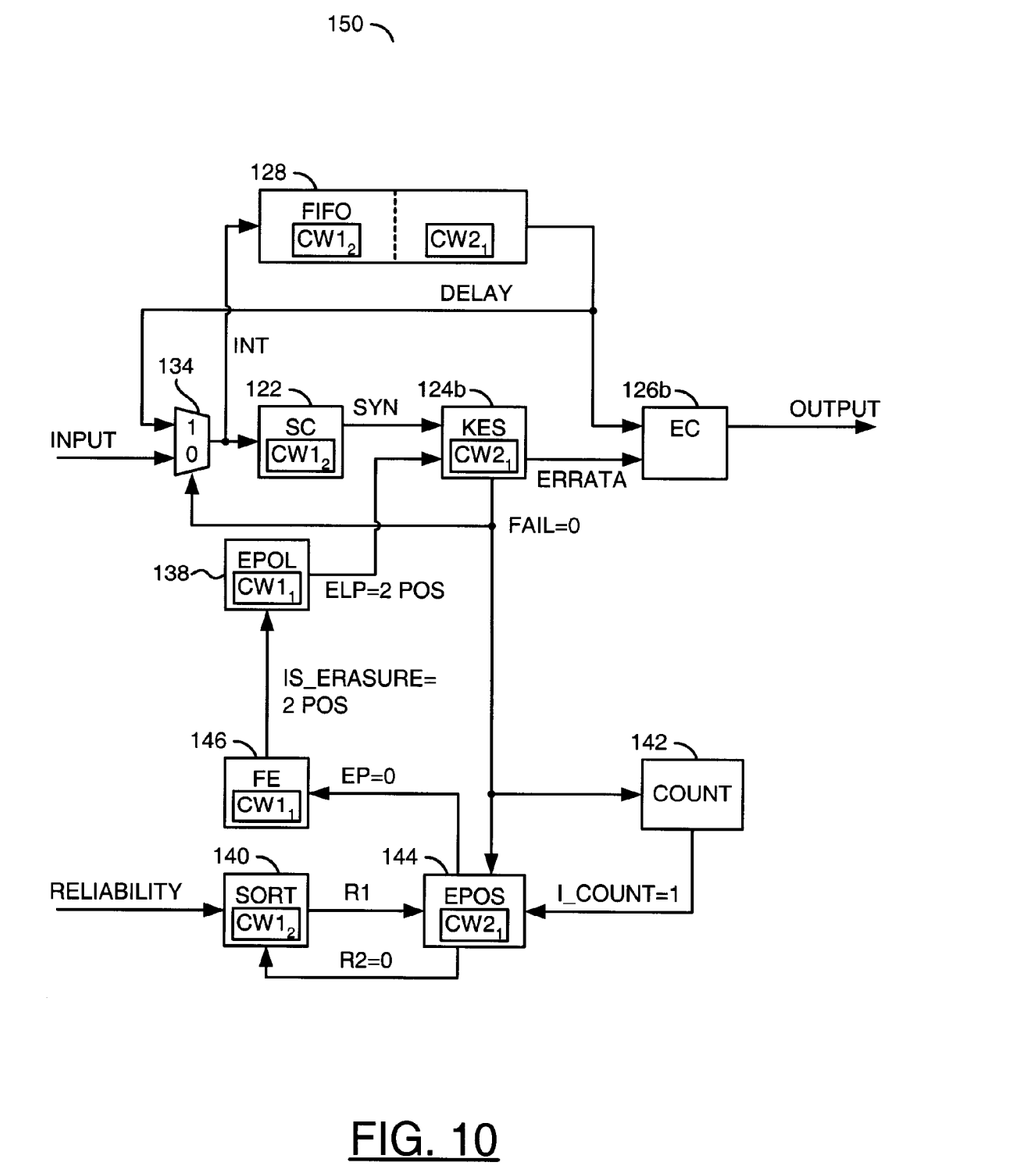
FIG. 10 is a block diagram illustrating the apparatus at the end of a third step in the decoding.

Referring to FIG. 10, a block diagram illustrating the apparatus 150 at the end of a third step in the decoding is shown.

In the third step, the codeword $CW1_1$ may be presented from an output of the circuit 128 back through the circuit 134 to both an input of the circuit 128 and an input of the circuit 122 (now designated as $CW1_2$). The circuit 122 may subsequently generate the syndromes for the codeword $CW1_2$ a second time. The circuit 124b may operate on the codeword $CW2_1$ independent of any reliability information. The circuit 140 may do nothing because the two reliability arrays for the codeword $CW1_2$ were previously sorted in the first step (e.g., $CW1_2=CW1_1$). The circuit 142 may generate the value of the signal I_COUNT as 1 to indicate a first iteration of the codeword $CW2_1$ to the circuit 144. The circuit 144 may receive the signal I_COUNT and processes the sorted reliability arrays for the codeword $CW2_1$. The circuit 146 may form the signal IS_ERASURE for 2 erasure positions caused by the failure during the initial iteration of the codeword $CW1_1$. The circuit 138 may generate the erasure locator polynomial for the 2 erasures in the codeword $CW1_1$.

At the end of the third step, the circuit 128 generally contains the codewords $CW2_1$ and $CW1_2$. The circuit 122 has calculated the syndromes for the codeword $CW1_2$. The circuit 124b has calculated the errata polynomial for the codeword $CW2_1$ and deassert the signal FAIL, meaning that no extra errors were found in the codeword $CW2_1$. The circuit 140 may pass the two reliability arrays the codeword $CW1_2$ to the circuit 144 a second time. The circuit 144 may have dumped the 2 erasure positions for the codeword $CW2_1$ because the signal FAIL is deasserted. The circuit 146 has calculated the erasure location vector for the codeword $CW1_1$ (e.g., IS_ERASURE=2 positions). The circuit 138 has calculated the 2 erasure positions for the codeword $CW1_1$ (e.g., ELP=2 positions).

Figure 11:
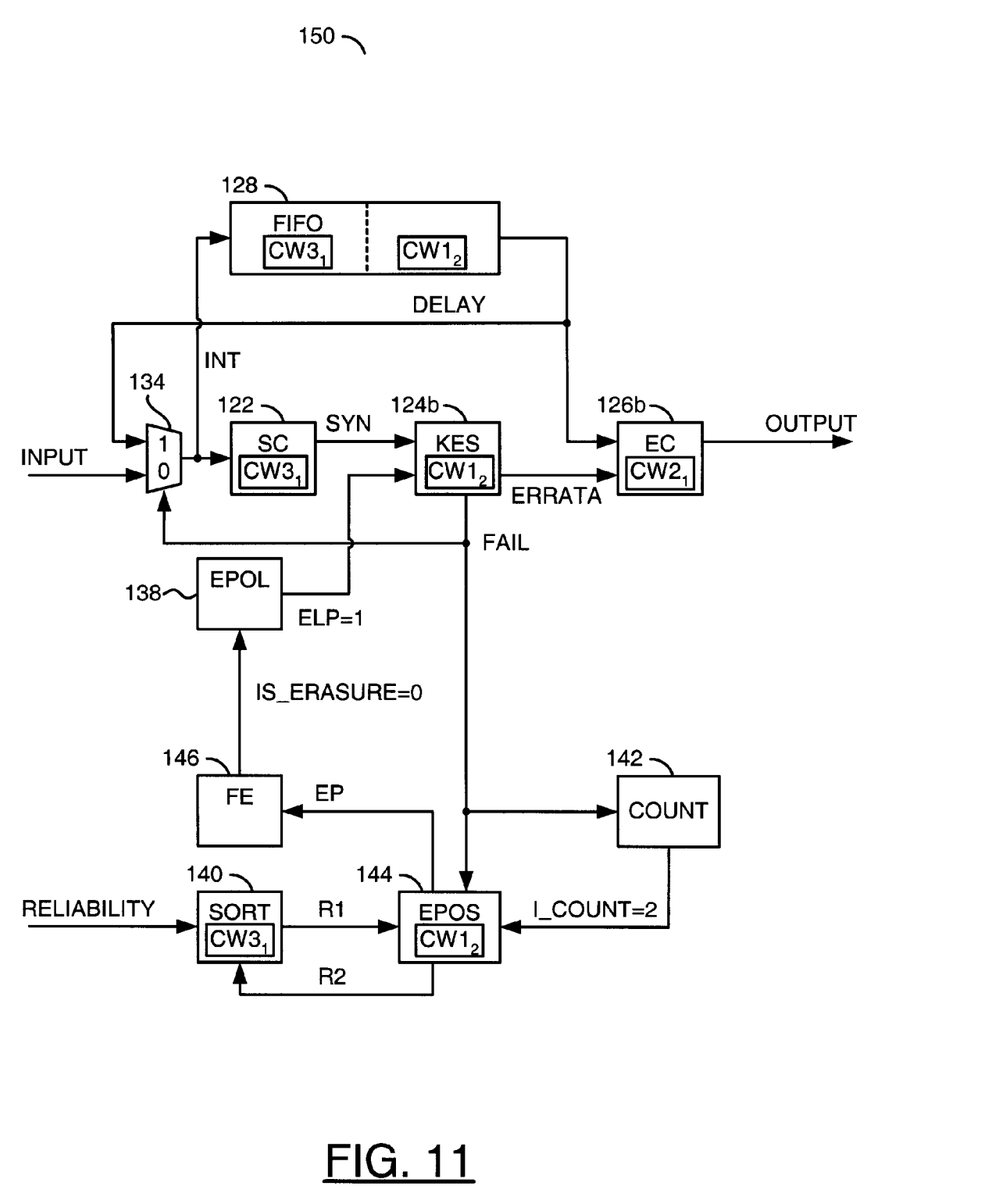
FIG. 11 is a block diagram illustrating the apparatus at the end of a fourth step in the decoding.

Referring to FIG. 11, a block diagram illustrating the apparatus 150 at the end of a fourth step in the decoding is shown. In the fourth step, the circuit 122 may calculate the syndromes for a third codeword (e.g., $CW3_1$). The circuit 124b may process the syndromes of the codeword $CW1_2$ a second time using the erasure locator polynomial (e.g., 2 erasures) calculated during the first iteration of the codeword $CW1_1$. The circuit 126b may correct any correctable errors found in the codeword $CW2_1$. The circuit 128 may buffer the codeword $CW3_1$ and the codeword $CW1_2$. The circuit 140 may sort the reliability arrays for the codeword $CW3_1$. The circuit 142 may increment the signal I_COUNT=2 to indicate the second iteration of the codeword $CW1_2$ to the circuit 144. The circuit 144 may determine the 4 most-likely error positions for the codeword $CW1_2$. The circuit 146 may initialize the signal IS_ERASURE to indicate no erasures at the time for the codeword $CW3_1$. The circuit 138 may initialize the error locator polynomial to indicate no erasures during the first iteration of the codeword $CW3_1$. The circuit 124b may account for the 2 erasures while operating on the syndromes of the codeword $CW1_2$.

At the end of the fourth step, the circuit 128 may hold the codewords $CW1_2$ and $CW3_1$. The circuit 122 has calculated the syndromes for the codeword $CW3_1$. The circuit 124b has calculated the errata polynomial for the codeword $CW1_2$. If the degree of the errata polynomial for the codeword $CW1_2$ is no more than 2t during the second iteration, the circuit 124b may pass the errata polynomial to the circuit 126b and deassert the signal FAIL. In response to the deasserted signal FAIL, the circuit 144 may dump the 4 erasure positions determined from the codeword $CW1_2$ reliability arrays. If the degree of the errata polynomial for the codeword $CW1_2$ is greater than 2t during the second iteration, the circuit 124b may again assert the signal FAIL. The circuit 144 generally responses to the second assertion of the signal FAIL by passing (i) the 4 erasure positions to the circuit 146 and (ii) the two reliability arrays for the codeword $CW1_2$ back to the circuit 140. The circuit 126b has calculated the corrected codeword $CW2_1$. The circuit 140 has sorted the reliability arrays for the codeword $CW3_1$. The circuit 142 has incremented the count for the codeword $CW1_2$. The circuit 146 may initialize the signal IS_ERASURE. The circuit 138 may initialize the erasure locator polynomial, meaning that no erasures are available for the codeword $CW3_1$ during the initial iteration.

The functions performed by the diagrams of FIGS. 3 to 11 may be implemented using one or more of a conventional general purpose processor, digital computer, microprocessor, microcontroller, RISC (reduced instruction set computer) processor, CISC (complex instruction set computer) processor, SMID (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products) or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit that (i) generates a decoded codeword by decoding a first codeword based on a respective plurality of erasure location vectors and (ii) asserts a fail signal upon each failure of said decoding of said first codeword, said decoding comprising an error-and-erasure Reed-Solomon decoding, wherein (i) said first circuit comprises a buffer device that returns said first codeword to circuitry performing said decoding in response to said first codeword failing said decoding and (ii) said buffer device comprises hardware; and
a second circuit that (i) generates a count of said assertions of said fail signal and (ii) generates said erasure location vectors based on (a) said count and (b) a plurality of reliability items corresponding to said first codeword.

2. The apparatus according to claim 1, wherein (i) said reliability items comprise (a) a plurality of reliability values of a plurality of symbols in said first codeword and (b) a plurality of symbol positions of said symbols in said first codeword, and (ii) said second circuit comprises a sorter that sorts (a) said reliability values by magnitude into an order and (b) said symbol positions into said order.

3. The apparatus according to claim 2, wherein said second circuit further comprises an erasure position calculator that generates a plurality of erasure positions by copying a portion of said symbol positions having a plurality of smallest reliabilities respectively a size of said portion being determined by said count.

4. The apparatus according to claim 3, wherein (i) said second circuit further comprises a formation module that generates said erasure location vectors based on said erasure positions and (ii) said erasure location vectors are different than said erasure positions.

5. The apparatus according to claim 1, wherein said first circuit comprises a syndrome calculator that begins said decoding of said first codeword a first time.

6. The apparatus according to claim 5, wherein said first circuit further comprises a key equation solver that continues said decoding of said first codeword said first time while said syndrome calculator begins said decoding of a second codeword.

7. The apparatus according to claim 1, wherein (i) said buffer device returns said first codeword to a syndrome calculator in response to said first codeword failing said decoding and (ii) said syndrome calculator beginning said decoding of said first codeword a next time.

8. The apparatus according to claim 7, wherein said first circuit further comprises an error corrector that finishes said decoding of a second codeword while a key equation solver continues said decoding of said first codeword.

9. The apparatus according to claim 1, wherein said first circuit further comprises an erasure polynomial module that generates a plurality of erasure locator polynomials based on said erasure location vectors.

10. The apparatus according to claim 1, wherein both said first circuit and said second circuit comprise hardware-only circuitry.

11. A method of soft Reed-Solomon decoding, comprising the steps of:
(A) generating a decoded codeword by decoding a first codeword based on a respective plurality of erasure location vectors using a circuit, said decoding comprising an error-and-erasure Reed-Solomon decoding;
(B) asserting a fail signal upon each failure of said decoding of said first codeword;
(C) returning said first codeword from a buffer device to circuitry performing said decoding in response to said first codeword failing said decoding;
(D) generating a count of said assertions of said fail signal; and
(E) generating said erasure location vectors based on (i) said count and (ii) a plurality of reliability items corresponding to said first codeword.

12. The method according to claim 11, wherein said reliability items comprise (i) a plurality of reliability values of a plurality of symbols in said first codeword and (ii) a plurality of symbol positions of said symbols in said first codeword, the method further comprising the steps of:
sorting said reliability values by magnitude into an order; and
sorting said symbol positions into said order.

13. The method according to claim 12, further comprising the step of:
generating a plurality of erasure positions by copying a portion of said symbol positions having a plurality of smallest reliabilities respectively, a size of said portion being determined by said count.

14. The method according to claim 13, further comprising the step of:
generating said erasure location vectors based on said erasure positions, wherein said erasure location vectors are different than said erasure positions.

15. The method according to claim 11, further comprising the step of:
calculating a plurality of first syndromes of said first codeword a first time.

16. The method according to claim 15, further comprising the parallel steps of:
solving a plurality of key equations of said first codeword said first time; and
calculating a plurality of second syndromes of a second codeword.

17. The method according to claim 11, wherein said buffer device returns said first codeword to a syndrome calculator in response to said first codeword failing said decoding, the method further comprising the step of:
calculating said first syndromes of said first codeword a next time.

18. The method according to claim 17, further comprising the parallel steps of:
correcting errors in a second codeword; and
solving a plurality of key equations of said first codeword.

19. The method according to claim 11, further comprising the step of:
generating a plurality of erasure locator polynomials based on said erasure location vectors.

20. An apparatus comprising:
means for (i) generating a decoded codeword by decoding a first codeword based on a respective plurality of erasure location vectors and (ii) asserting a fail signal upon each failure of said decoding of said first codeword, said decoding comprising an error-and-erasure Reed-Solomon decoding;
means for storing said first codeword that returns said first codeword to circuitry performing said decoding in response to said first codeword failing said decoding; and
means for (i) generating a count of said assertions of said fail signal and (ii) generating said erasure location vectors based on (a) said count and (b) a plurality of reliability items corresponding to said first codeword.

* * * * *